US007587185B2

(12) United States Patent
Nee (10) Patent No.: US 7,587,185 B2
(45) Date of Patent: Sep. 8, 2009

(54) AUTOMATIC BROADCAST CHANNEL TUNING APPARATUS AND METHOD

(75) Inventor: Wright J. Nee, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 972 days.

(21) Appl. No.: 09/903,131

(22) Filed: Jul. 11, 2001

(65) Prior Publication Data
US 2003/0013425 A1 Jan. 16, 2003

(51) Int. Cl.
*H04B 1/18* (2006.01)
(52) U.S. Cl. .............. 455/186.1; 455/161.2; 455/179.1; 455/181.1
(58) Field of Classification Search .............. 455/179.1, 455/186.1, 3.04, 419, 166.1, 427, 154.1, 455/158.5, 3.06, 161.1–161.3, 181.1, 3.01; 704/500; 701/200; 709/217; 370/527
See application file for complete search history.

(56) References Cited

U.S. PATENT DOCUMENTS

| | | | | |
|---|---|---|---|---|
| 4,476,582 A * | 10/1984 | Strauss et al. | ............. | 455/166.1 |
| 4,969,209 A | 11/1990 | Schwob | ............. | 455/158 |
| 5,001,775 A | 3/1991 | Hayashi et al. | ............. | 455/158 |
| 5,048,119 A | 9/1991 | Wassink | ............. | 455/161 |
| 5,152,012 A | 9/1992 | Schwob | ............. | 455/158.5 |
| 5,307,513 A | 4/1994 | Harada | ............. | 455/186.1 |
| 5,393,713 A * | 2/1995 | Schwob | ............. | 455/158.5 |
| 5,584,061 A * | 12/1996 | Kimura et al. | ............. | 455/186.1 |
| 5,654,719 A | 8/1997 | Kunii | ............. | 342/451 |
| 5,734,973 A | 3/1998 | Honda | ............. | 455/186.1 |
| 5,802,066 A * | 9/1998 | Miyake et al. | ............. | 370/527 |
| 5,819,166 A * | 10/1998 | Kimura et al. | ............. | 455/186.1 |
| 5,864,753 A * | 1/1999 | Morita et al. | ............. | 455/186.1 |
| 5,964,821 A | 10/1999 | Brunts et al. | ............. | 701/201 |
| 6,112,063 A | 8/2000 | Ravi et al. | ............. | 455/186.1 |
| 6,374,177 B1 * | 4/2002 | Lee et al. | ............. | 701/200 |

(Continued)

OTHER PUBLICATIONS

Dr. A. J. Bower, "Digital Radio—A Revolution For In-Car Entertainment"; Proceedings of NavPos Automative 1998 Conference, Birmingham, England, Jun. 10, 1998, vol. 2, Session 5-8, pp. 40-51.

(Continued)

*Primary Examiner*—Harry S Hong
(74) *Attorney, Agent, or Firm*—James R. Nock (57) ABSTRACT

An apparatus, program product and method in which a set of broadcast channels is automatically selected on a mobile receiver based on the mobile receiver's current location, a database of broadcast sources contained within the mobile receiver, and a predefined set of user preferences. This location based selection of broadcast channels may be implemented by first querying a user for personal preferences. These user preferences, along with a database of broadcast sources and program formats, are then loaded into the mobile receiver. The mobile receiver includes a means for determining the current location of the receiver, as the receiver moves from location to location. After the location of the receiver is determined, the database of broadcast sources and program formats are searched in order to determine broadcast sources that can be received by the receiver in its current location. After the receivable broadcast sources have been identified, one or more groups of broadcast channels are created, based on the set of user preferences. These groups of broadcast channels are then assigned to user selectable functions within the receiver.

36 Claims, 6 Drawing Sheets

U.S. PATENT DOCUMENTS

| | | | |
|---|---|---|---|
| 6,600,898 B1 * | 7/2003 | De Bonet et al. | 455/3.04 |
| 6,609,096 B1 * | 8/2003 | De Bonet et al. | 704/500 |
| 6,658,231 B2 * | 12/2003 | Nakatsuyama | 455/3.06 |
| 6,725,022 B1 * | 4/2004 | Clayton et al. | 455/154.1 |
| 6,728,522 B1 * | 4/2004 | Marrah et al. | 455/179.1 |
| 6,728,531 B1 * | 4/2004 | Lee et al. | 455/419 |
| 6,799,201 B1 * | 9/2004 | Lee et al. | 709/217 |
| 6,829,475 B1 * | 12/2004 | Lee et al. | 455/419 |
| 6,985,694 B1 * | 1/2006 | De Bonet et al. | 455/3.01 |
| 2002/0183059 A1 * | 12/2002 | Noreen et al. | 455/427 |
| 2003/0032399 A1 * | 2/2003 | Slupe | 455/161.2 |
| 2003/0040272 A1 * | 2/2003 | Lelievre et al. | 455/3.06 |

OTHER PUBLICATIONS

Dave Carpenter, "Internet is Tuning out Car Radios", Aug. 6, 2000; http://www.onnneathens.com/stories.

* cited by examiner

| Station | Freq. | City | State | Region | CityCode | ZipCode | Format | Coordinate | Range | Prog. Sched. |
|---|---|---|---|---|---|---|---|---|---|---|
| WXYZ | 97.3 | Minneapolis | MN | MW | MSP | 55441 | Rock | 43N 57.203... | 50 | ^ Fig 4B |
| WBBB | 99.2 | Minneapolis | MN | MW | MSP | 55440 | Country | 43N 57.231... | 40 | ^ Fig 4B |
| WCCC | 98.3 | Rochester | MN | MW | ROC | 55901 | Sports | 43N 52.891... | 40 | ^ Fig 4B |

AUTOMATIC BROADCAST CHANNEL TUNING APPARATUS AND METHOD

FIELD OF THE INVENTION

This invention is generally related to selecting broadcast channel information, and in particular, to selecting a set of broadcast channels based on user location and user preferences.

BACKGROUND OF THE INVENTION

As the number of available sources of broadcast programming increases, it becomes more and more difficult for consumers to locate program material of interest among the myriad of choices. In the early days of radio, a listener was often presented with a very small number of listening options within a given radio market. In the past, most radio stations within a given market broadcast a roughly equivalent program mix of news, sports, music and entertainment programming.

Over the past decades, the number of broadcast channels available to consumers in all broadcast mediums has risen dramatically. As of Sep. 30, 2000, there were over 4600 AM and 8000 FM radio stations, and over 1600 television stations licensed to broadcast within the United States. As an example, in New York City alone, there are 28 AM and 43 FM radio stations.

As the number of broadcast channels has increased, the diversity and differentiation of program materials amongst the stations has risen correspondingly. Stations now typically offer programming formats tightly tailored to target specific demographic audiences. Examples of the new formats include: Easy Listening, Jazz, Hard Rock, Religious, Talk Radio, Sports, News, Ethnic, and Children's Programming.

As a result, it can be a daunting task for a user to "surf" through the multitude of channels and program formats to find a program of interest. In order to alleviate this problem, modern radio receivers commonly employ user definable preset buttons where a user can assign a particular radio frequency to a button on the radio receiver, allowing the user direct access to a favorite frequency. In this way, a listener can customize their radio receiver to best fit their listening habits.

While programmable station presets offer a significant step forward in listener convenience, a listener still must perform the rather onerous task of programming the station presets into their radio receiver. In other words, the user must traverse the entire spectrum of receivable stations in their area one-by-one, deciding whether the station should be added to a programmable preset button. Since the number of user definable preset buttons is usually quite small, the listener must be judicious in the selection of stations for the presets. Also, when a listener traverses the stations during the programming operation, the station may be broadcasting material which does not indicate its format (e.g., commercials or news at the top of the hour). In this instance, the listener might inadvertently skip a station which is of interest to the listener or be forced to wait though commercials when programming the radio receiver.

Also, the stations selected by the listener at the time of programming are statically stored in the radio receiver, while radio stations and formats change dynamically. That is, station formats can change, stations can appear or disappear, and listener's program preferences may change. In these instances, the preset buttons on radio receiver must be periodically re-programmed with the updated listening choices.

Perhaps the most daunting problem with a static set of user defined presets, is the fact that many listeners are mobile and the broadcasting range of most stations is quite limited. For instance, many listeners commute back and forth to work every day in their automobile over relatively long distances. Stations that are tunable at a listener's home location may not be tunable at a user's work location. There is also a significant percentage of listeners who are itinerant by the nature of their professions (e.g., over-the-road truck drivers, traveling sales representatives, etc.). Also, most listeners find themselves occasionally in distant locations where their standard set of radio presets in their automobile or portable device no longer tune to listenable stations.

To partially alleviate this problem, some radio receivers offer a feature where the radio will automatically load the direct access preset buttons with the strongest available stations in the listener's location at the time of programming. While this feature provides the listener with a set of stations to listen to at virtually any location, the stations loaded into the presets may not be of interest to the user. Also, there are usually many more listenable stations than there are presets available on the radio receiver. Thus, many stations of particular interest to the listener may not be loaded into the presets because of the limited space available.

SUMMARY OF THE INVENTION

The invention addresses these and other problems associated with the prior art by providing an apparatus, program product and method in which a user can select a set of broadcast channels based on the user's current location and other preferences.

This location based selection of broadcast channels may be implemented, for example, by first querying a user as to personal preferences. These user preferences, along with a database of broadcast sources and/or program formats, are then loaded into a mobile receiver. The receiver includes a means for determining the current location of the receiver, as the receiver moves from location to location. After the location of the receiver is determined, the receiver at its current geographic location searches the database of broadcast sources and program formats in order to determine broadcast sources that are receivable. After the receivable broadcast sources have been identified, one or more groups of receivable broadcast sources are created, based on the set of user preferences. These groups of receivable broadcast sources are then assigned to user selectable functions within the receiver.

The present invention contemplates several methods for determining the current location of the receiver. In one embodiment, the location information is entered by the user at the receiver itself, via a keypad or voice entry. The location information can take several forms: including a zip code, a city code, a geographical coordinate, or a city name. In another embodiment, the location information is provided to the receiver via a global positioning system (GPS) receiving device, located either internally or externally to the receiver.

The present invention also contemplates several methods for providing a database of broadcast sources and program formats to the receiver. In one embodiment, the database of broadcast sources and program formats may include, but is not limited to, a station identifier, a station format, a station location, a broadcast range, and program schedule information.

In one embodiment, the database of broadcast sources and program formats is provided to the receiver by a removable memory module. In alternate embodiments, the database is provided to the receiver via a CD-ROM disc, a CD-RW disc, or a writeable DVD disc. In yet another embodiment, the database is provided to the receiver via a remote transfer from an external device, by a wired or wireless connection. Examples of such external devices include, but are not limited to, personal data assistants (PDAs), personal computers (PCs), laptop computers and wireless phones.

The set of user preferences is provided to the receiver by entry at the receiver itself, or alternately by entry at an external device, then transferred to the receiver via means such as described in the previous paragraph.

These and other advantages and features, which characterize the invention, are set forth in the claims annexed hereto and forming a further part hereof. However, for a better understanding of the invention, and of the advantages and objectives attained through its use, reference should be made to the drawings, and to the accompanying descriptive matter, in which there is described exemplary embodiments of the invention.

DETAILED DESCRIPTION

Figure 1:
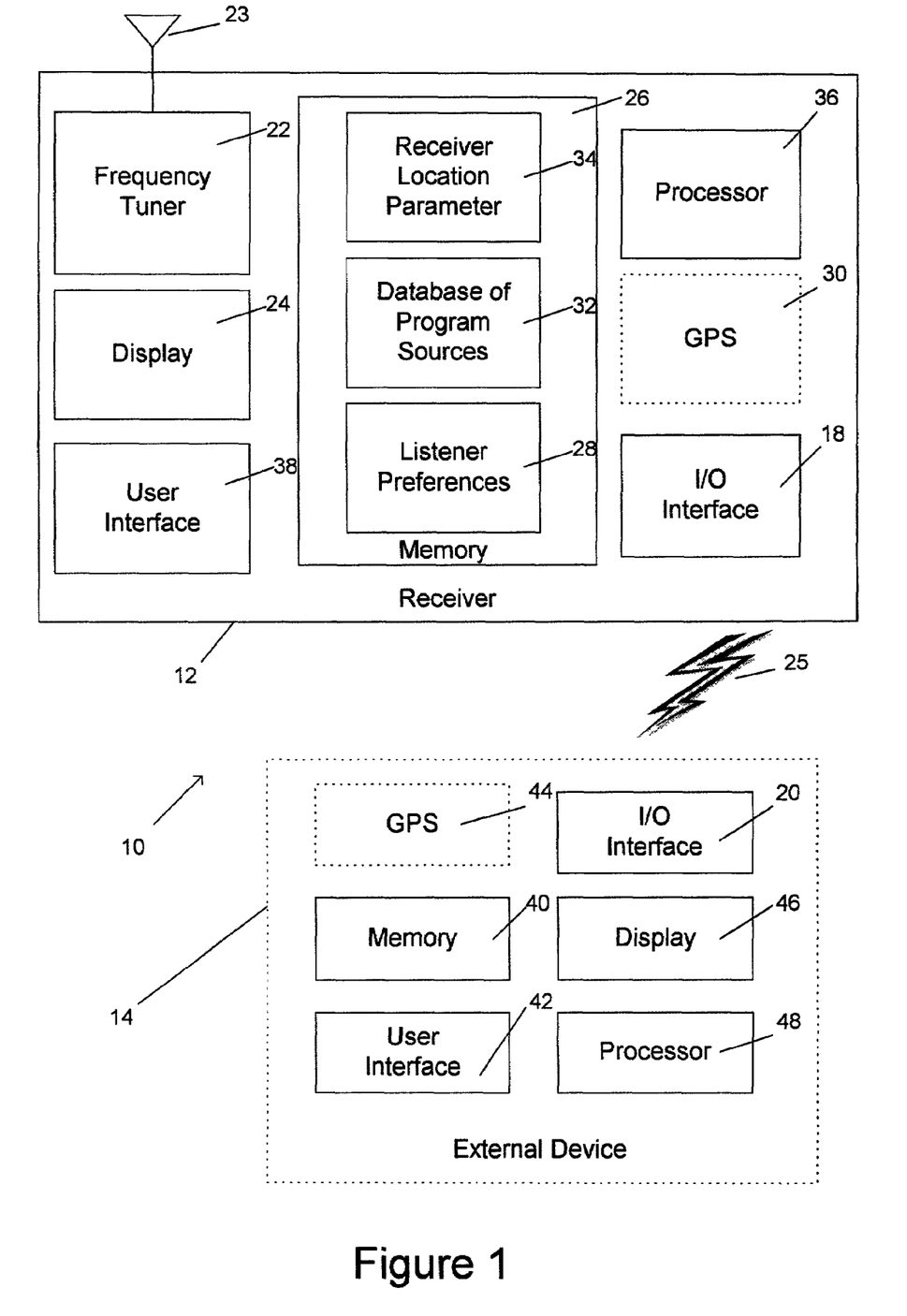
FIG. 1 is a block diagram of a system incorporating an automatic broadcast channel tuning apparatus consistent with the invention.

Turning to the Drawings, wherein like numbers denote like parts throughout the several views, FIG. 1 illustrates a system 10 for automatic broadcast channel tuning in accordance with the present invention. System 10 includes a receiver 12 for receiving a plurality of broadcast channels and an optional external device 14 for transferring a database of broadcast sources and program formats and/or a set of user preferences to receiver 12.

External device 14 may also supply location information to receiver 12.

External device 14 communicates with receiver 12 via either a wired or wireless connection 25 between receiver I/O interface 18 and external device I/O interface 20. In the preferred embodiment, receiver 12 uses the location information, supplied either internally or externally, along with the set of user preferences and the database of broadcast sources and program formats to create one or more groups of broadcast channels. These groups of broadcast channels are then assigned to user selectable functions within receiver 12.

Automatic broadcast channel tuning is implemented in the illustrated implementation within receiver 12. Receiver 12 is any device capable of receiving a group of broadcast signals from a plurality of broadcast sources. Receiver 12 can take several forms, including, but not limited to: a radio in a mobile vehicle such as a car, airplane, or boat; a portable handheld radio; or a portable television receiver. In the preferred embodiment, the broadcast signals are radio signals (i.e., AM or FM band signals), however, the present invention is applicable to other types of broadcast signals including, but not limited to, television signals, emergency broadcast signals, weather signals, etc. Receiver 12 receives the plurality of signals via frequency tuner 22, though an antenna 23.

A display 24, provides a visual indication of the currently tuned frequency, and can include additional information such as the current time/date, the call letters/location of the station broadcasting the currently tuned frequency, the name of the program currently being broadcast, and other relevant information.

Receiver 12 further includes a memory 26 for storing both program code suitable for execution by a processor 36, as well as additional data structures required by the processor in controlling the operation of the receiver. Processor 36 may represent one or more processors (e.g., microprocessors or microcontrollers), and memory 26 may represent the random access memory (RAM) devices comprising the main storage of the receiver, as well as any supplemental levels of memory, e.g., cache memories, non-volatile or backup memories (e.g., programmable or flash memories), read-only memories, etc. In addition, memory 26 may be considered to include memory storage physically located elsewhere in receiver 12, e.g., any cache memory in processor 36, as well as any storage capacity used as a virtual memory.

Memory 26 includes a location parameter 34 indicating the current location of the receiver. Location parameter 34 can be represented in multiple formats, including, but not limited to: a latitude/longitude coordinate, a city code, a zip code, a city name, or a state name. Location parameter 34 may be entered directly by the user at the receiver via user interface 38, passed from external device 14, or generated by a global positioning system (GPS) unit 30 integral to receiver 12.

Memory 26 further includes a database of broadcast sources 32. In its simplest form, database of broadcast sources 32 includes a station identifier, a station format, and a station location. Database of broadcast sources 32 may also include additional information, such as city, state, and region for the station, broadcast range, and program information for the station. Database of broadcast sources 32 is further described subsequently in FIGS. 4A and 4B.

Memory 26 also includes a set of listener preferences 28. As in a conventional receiver, listener preferences can include memorized station presets; volume, balance, fader, bass and treble settings, etc. In addition to the conventional preferences, listener preferences 28 can also include user defined programming choices, such as specific syndicated programming (e.g., Rush Limbaugh, Dr. Laura Schlessinger, Bob & Tom, Money Talk, etc.), which can be assigned to user definable pushbutton controls on receiver 12.

In one embodiment, receiver 12 optionally includes a global positioning system (GPS) unit for determining the current location of the receiver. In an alternative embodiment, location information can be supplied to the receiver by a user entering the location information at the receiver via a user interface 38. In yet another alternative embodiment, location information can be supplied to receiver 12 via external device 14.

As previously stated, an optional external device 14 may be used to transfer a variety of information to receiver 12, including but not limited to, a database of broadcast sources and program formats, listener preferences and location information. External device 14 can take a wide variety of forms, including, but not limited to: a personal digital assistant (PDA), a laptop computer, a desktop computer, a wireless phone, or a GPS receiver. External device includes I/O interface 20, a memory 40, a user interface 42, a display 46, a processor 48, and an optional GPS unit 44, which provide essentially the same function as previously described for their counterparts in receiver 12. External device 14 communicates with receiver 12 via a wide variety of wired and wireless communication protocols, including but not limited to: serial port-to-port, USB, Ethernet, WLAN 802.11, infrared, and Bluetooth.

It is anticipated that multiple external devices 14 may be employed to transfer information to receiver 12. As an example, a desktop computer may be used to define user preferences. The user preferences may then be transferred to a PDA. The PDA may then be used to transfer the user preferences to receiver 12 via wired/wireless link 25.

Figure 2:
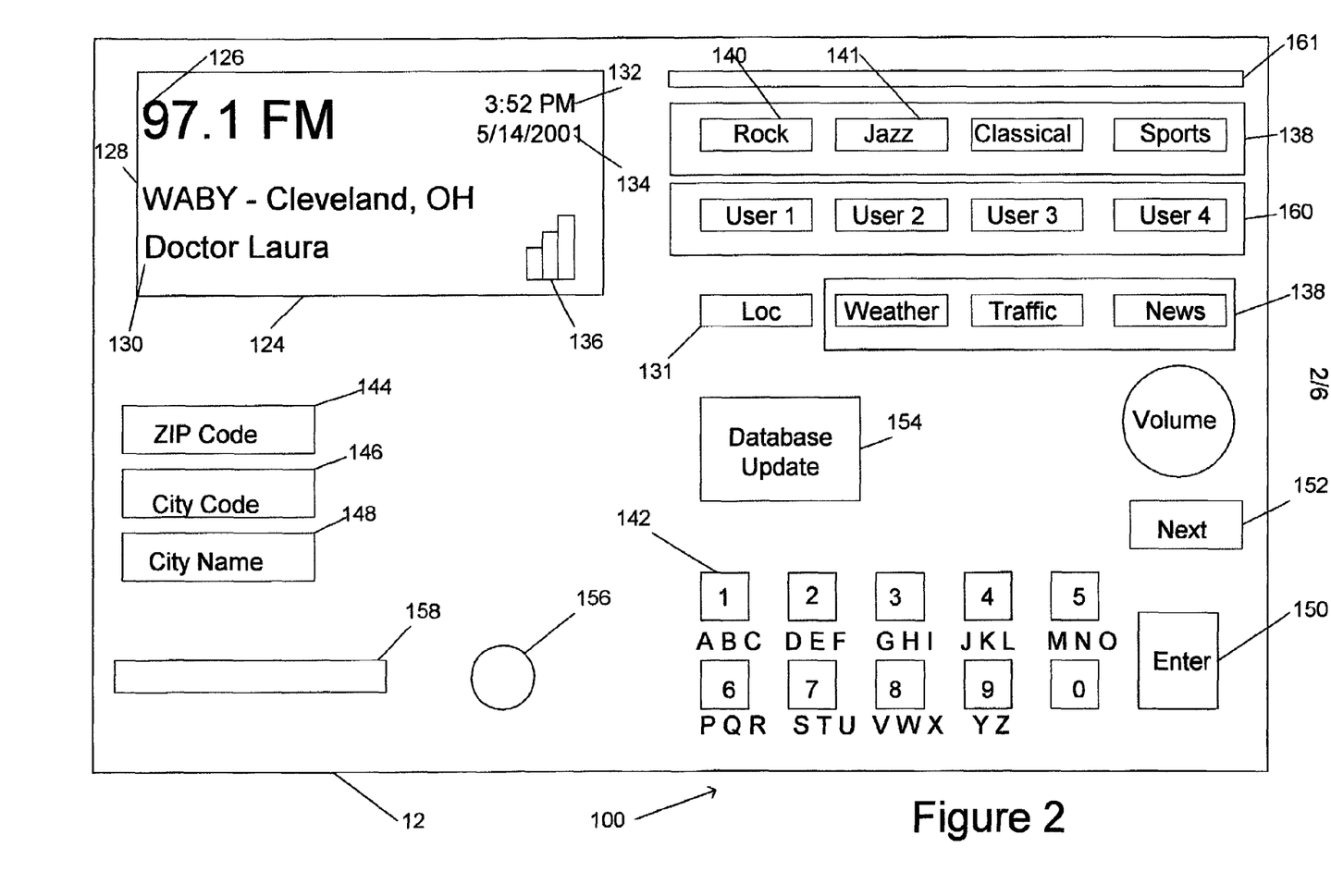
FIG. 2 illustrates an example front panel of the automatic broadcast channel tuning apparatus of FIG. 1.

Now turning to FIG. 2, an example front panel of the automatic broadcast channel tuning apparatus (i.e. receiver 12) is shown generally at 100. In the illustrated embodiment, display area 124 includes visual indication of the current tuned frequency 126, station call letters and location 128, program information 130, current time 132, current date 134, and volume indication 136. It is anticipated that display area 124 can display a variety of other operational parameters in a variety of different formats and organizational schemes and still remain within the scope of the present invention.

The illustrated embodiment also includes a number of pushbuttons and other controls to accommodate entry of user selections for operation of receiver 12. The illustrated embodiment includes a "LOC" pushbutton 131 for obtaining the current location information for receiver 12. As mentioned previously, there are several methods for determining the current location of receiver 12. In one embodiment, depressing "LOC" button 131 activates GPS unit 30 internal to receiver 12. The current location information for receiver 12 is then stored as receiver location parameter 34 in memory 26. In another embodiment, depressing the "LOC" button 131 enables the transfer of location information from external device 14, such as a GPS receiver. In other embodiments described below, depressing a "ZIP CODE" pushbutton 144, a "CITY CODE" pushbutton 146, or a "CITY NAME" pushbutton 148 enables user entry of location information.

In the first user entry embodiment, a user may enter the current location via a zip code, via "ZIP CODE" pushbutton 144. After activating the "ZIP CODE" pushbutton 144, a user then enters a five-digit zip code for the current location via pushbuttons 142 then selects the "ZIP CODE" pushbutton 144 again to complete the entry. As each digit of the zip code is entered, it is displayed on display 24 for visual verification. In an alternative embodiment, a user may enter the current location via a city code, via a "CITY CODE" pushbutton 146. It is envisioned that the city code would correspond to the 3 character airport code for the nearest city, but a wide variety of alternative city code designations would also be workable within the scope of the present invention.

In this embodiment, the user selects the "CITY CODE" pushbutton 146, then enters a three character alphabetic code via pushbuttons 142 then again selects the "CITY CODE" pushbutton 146 to complete the entry. The three digit alphabetic code can be entered in a variety of ways. In one embodiment, the first letter of the three digit alphabetic code is entered by pressing the pushbutton 142 located directly over the set of letters that contain the desired letter. As an example, to select the airport code "LAX" for Los Angeles, the user would depress the "4" pushbutton three times (since "L" is the third letter listed under the "4"), then depress the "NEXT" pushbutton 152 to proceed to the second letter. To enter the second letter "A", the user would depress the "1" button once (since "A" is the first letter listed under the "4"), then depress the "NEXT" pushbutton 152 to proceed to the third letter. Finally, to enter the third letter "X", the user would depress the "8" pushbutton three times (since "X" is the third letter listed under the "8"), then depress the "CITY CODE" pushbutton 146 to complete entry of the three digit city code.

In yet another alternative embodiment, a user may enter the current location via a city name, via a "CITY NAME" pushbutton 148. In this embodiment, the user selects "CITY NAME" pushbutton 148, enters an alphabetic city name via pushbuttons 142 (i.e., in a manner similar to that described for entry of a city code in the preceding paragraph) then again selects the "CITY NAME" pushbutton 148 to complete the entry of the three digit city code. It is anticipated that predictive schemes can be employed to provide a shortcut for entry of common city names and city codes.

It is contemplated that wide variety of additional means and methods for supplying location information to the receiver (e.g., voice input) can be used and still remain within the scope of the present invention.

In the illustrated embodiment, receiver 12 includes a "DATABASE UPDATE" pushbutton 154, which enables the transfer and update of the database of broadcast sources 32 within receiver 12 from an external source, such as external device 14. "DATABASE UPDATE" pushbutton 154 can also enable the transfer of additional information from external device 14, such as program information and listener preferences. Typically, after "DATABASE UPDATE" pushbutton has been activated, receiver 12 is put into a mode to accept the wired/wireless transfer of information from external device via I/O communications port 156.

In an alternative embodiment, updated database information, such as the database of broadcast sources 32, program information, and listener preferences 28, is provided to receiver 12 via a portable, pluggable memory card (e.g., SmartMedia memory card, CompactFlash memory card, etc.) that is inserted into receiver at an external memory port 158.

In further alternative embodiments, updated database information, such as the database of broadcast sources 32, program information, and listener preferences 28, is provided to receiver 12 via portable media discs, such as CD-ROMs, CD-RWs, or DVDs. These portable media discs are inserted into receiver 12 at disc media receiver 161.

A number of predefined program format selection buttons are shown generally at 138. These predefined program format selection buttons 138 allow direct access to a number of currently receivable broadcast stations having the selected format. For instance, if a user activates the "ROCK" program format selection button 140, the user can directly access currently receivable "ROCK" stations by depressing the "1", "2", "3" etc. direct access buttons shown generally at 142. Similarly, if a user activates the "JAZZ" program format selection button 141, the user can then directly access currently receivable "JAZZ" stations by depressing the "1", "2", "3" etc. direct access buttons 142. After a user has selected direct access button 142, display information corresponding to the selected station will be shown at display area 124.

In one embodiment, the stations are assigned to direct access buttons 142 in closest geographical proximity order. That is, the station in closest geographical proximity to the user's location is assigned to the "1" direct access button, the second closest station is assigned to the "2" direct access button, etc. This feature enables the user to quickly identify which is the most "local" station, which may prove useful in order to get local news and weather during station breaks.

A number of user definable program format selection buttons are shown generally at 160. These user definable program format selection buttons 160 enable a user to define their own groupings of stations having a selected format or broadcasting a particular program. For instance, a user may be interested in football, more specifically the Minnesota Vikings. The Minnesota Vikings have a widespread radio network covering dozens of stations in several states. By defining a user definable program format selection button 160 (e.g. USER1) to hold only stations that are on the Minnesota Viking radio network, a user can easily find the Viking broadcast, as long as there is a station in the area that is part of the broadcast network. In a preferred embodiment, these user-defined assignments to programmable format selection buttons 160 is done at external device 14, then transferred to receiver 12 (more fully described in FIG. 5). However, it is contemplated that in an alternative embodiment, the user definition of program format selection buttons 160 can be done at receiver 12 itself. In another example, the user may prefer the musical format REGGAE, but there may not be a predefined program format selection button 138 that corresponds to REGGAE. In this instance, a user can assign a user definable program format selection button 160 (e.g. USER2) to hold only stations that play REGGAE format music.

Receiver 12 operates under the control of an embedded operating system, and executes or otherwise relies upon various software and/or firmware application, components, program, objects, modules, data structures, etc. In general, the routines executed to implement the embodiments of the invention, whether implemented as part of an operating system or a specific application, component, program, object, module or sequence of instructions, will be referred to herein as "computer programs", or simply "programs". The computer programs typically comprise one or more instructions that are resident at various times in various memory and storage devices in a computer, and that, when read and executed by one or more processors in a computer, cause that computer to perform the steps necessary to execute steps or elements embodying the various aspects of the invention.

Moreover, while the invention has and hereinafter will be described in the context of fully functioning computers and other programmable electronic devices, those skilled in the art will appreciate that the various embodiments of the invention are capable of being distributed as a program product in a variety of forms, and that the invention applies equally regardless of the particular type of data/signal bearing media used to actually carry out the distribution. Examples of data/signal bearing media include but are not limited to recordable type media such as volatile and non-volatile memory devices, floppy and other removable disks, hard disk drives, magnetic tape, optical disks (e.g., CD-ROM's, DVD's, etc.), among others, and transmission type media such as digital and analog communication links.

In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

Those skilled in the art will recognize that the exemplary environment illustrated in FIGS. 1 and 2 is not intended to limit the present invention. Indeed, those skilled in the art will recognize that other alternative hardware and/or software environments, including implementations partly or wholly in hardwired logic, may be used without departing from the scope of the invention.

Figure 3:
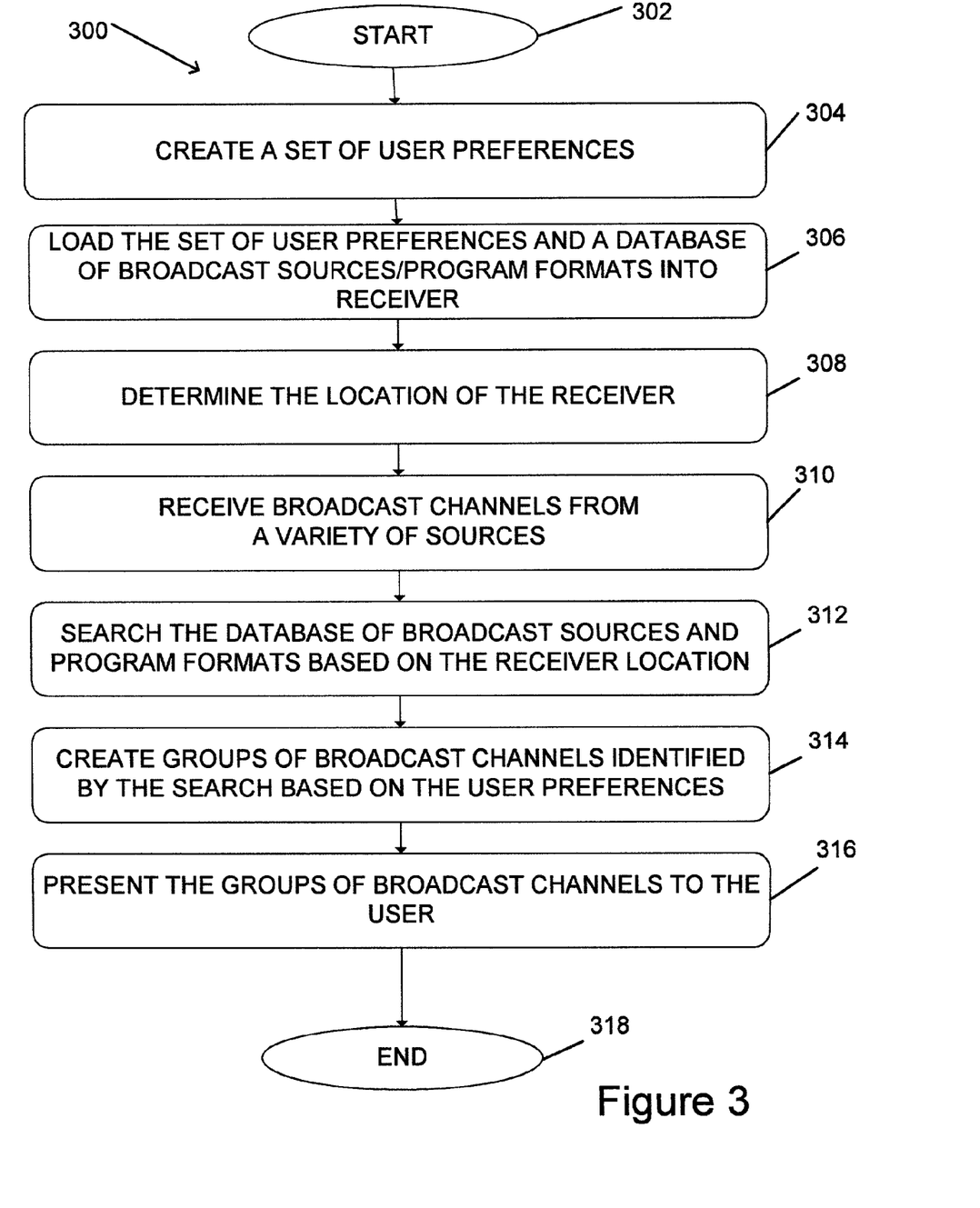
FIG. 3 is a flow diagram of a method for selecting broadcast signals on a receiver in accordance with the present invention.

Turning now to FIG. 3, a flow diagram is shown at 300 illustrating a method for selecting broadcast signals on receiver 12 in accordance with the present invention. The method begins at block 302. First, a set of user preferences is created at block 304. User preferences can include specific program formats or programs that are of special interest to a user. User preferences may also include geographic regions that the user will be traveling through, the level of detail for program information, and other operational characteristics. In a preferred embodiment, user preferences are created at remote device 14, then are transferred to receiver 12, as subsequently illustrated in FIG. 5. In an alternative embodiment, user preferences may be entered directly into receiver 12 (not illustrated).

After the user preferences have been created, the user preferences and a database of broadcast sources and/or program formats are entered in the receiver, as shown at block 306. There are several potential methods of providing this information to receiver 12. This information may be transferred via a wired/wireless link from external device 14, may be provided via a portable, pluggable memory module which is then plugged into receiver 12 at external memory port 158, or may be provided on a CD-ROM, CR-RW, or DVD to the receiver via disc media receiver 161.

Next, the location of receiver 12 is determined, as shown at block 308. As previously described, there are several ways that the location of the receiver can be determined. A GPS unit integrated into the receiver may determine the location of receiver 12. The location may also be passed to the receiver from a GPS unit external to the receiver, via a wired/wireless link. In another embodiment, a cellular (wireless) phone may be able to provide location information since it is in communication with a specific cellular tower at a fixed, known location. In yet another embodiment, the user can enter the location of the receiver manually by providing a location indicator, such as a zip code, city code, or city name.

Next, receiver 12 receives broadcast channels from a variety of broadcast sources, as shown at block 310. At block 312, receiver 12 then searches the database of broadcast sources and program formats based of the location of the receiver. Once the location of the receiver is known, the database of broadcast sources is traversed, record-by-record, extracting the location of each broadcast source. The location of receiver 12 is then compared to the location of the broadcast source in order to determine if the receiver is within receiving range of the broadcast source. In this way, extended information is extracted for each receivable station. Receivable stations are then assigned to predefined program format selection buttons 138, based on the extended information extracted for each receivable station (e.g., the station format).

After the list of receivable stations is built, groups of broadcast channels are created, based on the set of user preferences, as shown at block 314. The set of user preferences enables the user to establish a mapping of receivable stations (as determined at step 308) to a set of user groups. By way of example, a user determines that user group "1" will always contain Minnesota Vikings broadcast stations within receivable range, user group "2" will always contain stations that broadcast REGGAE format music within the current receivable range, user group "3" will always contain stations broadcasting the ESPN sports network within the current receivable range, and user group "4" will always contain stations which broadcast the Bob & Tom morning show within the current receivable range.

At block 316, the groups of broadcast channels defined by the user are presented to the user. In other words, the user groups are mapped to user definable program format selection buttons 160. In the example of the previous paragraph, if the user pushes the "USER 1" user definable program format selection button, they may then select stations, if any, that are currently broadcasting the Minnesota Vikings within range of the receiver. Similarly, if the user pushes the "USER 2" user definable program format selection button, they may then select, stations, if any that are currently broadcasting REGGAE format music within the current receivable range, and so on. Finally, at block 318, the method for selecting broadcast signals ends.

Figure 4A:
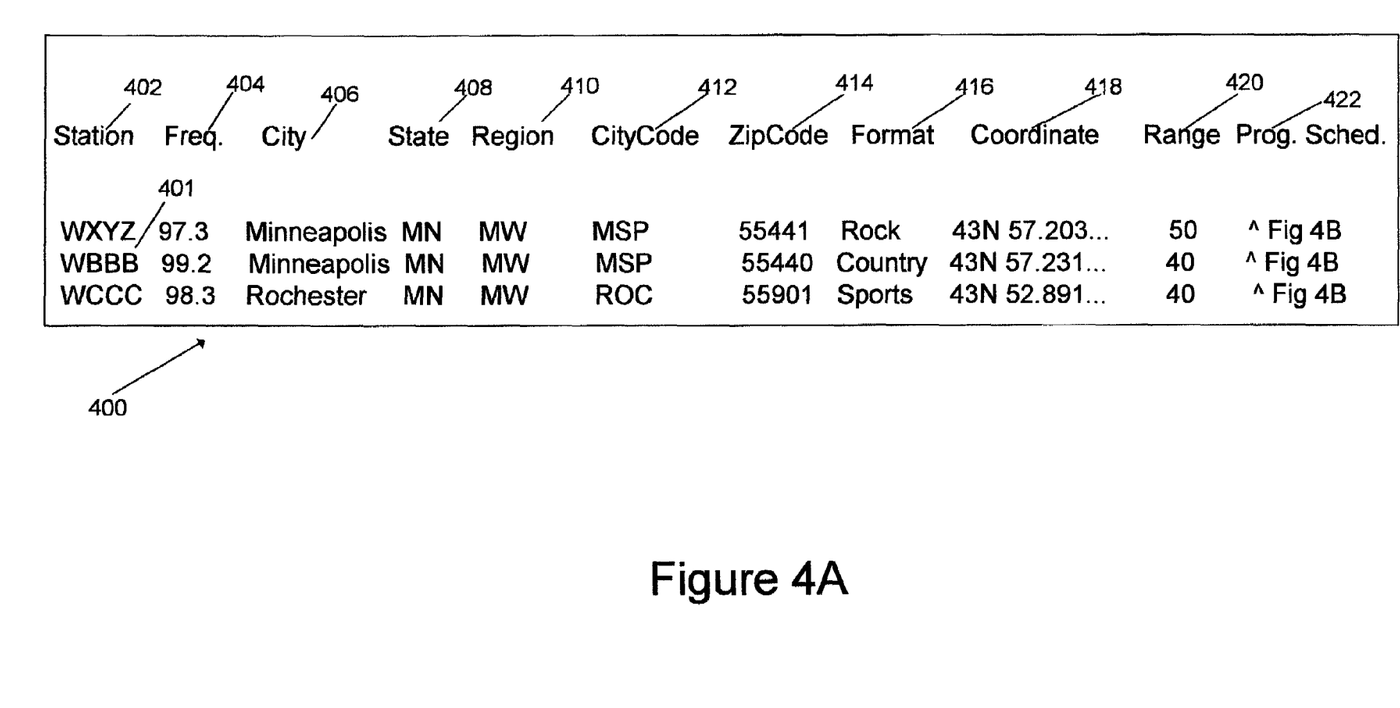
FIG. 4A is a representation of an example database/data structure of broadcast sources utilized by the automatic broadcast channel tuning apparatus of the present invention.

Turning now to FIG. 4A, a preferred embodiment of the database of program sources is illustrated generally at 400. This embodiment is displayed as a table for representational efficiency, however, the database/data structure can take on a variety of forms, including linked object lists, data structures, etc. In the illustrated embodiment, program source database 400 includes a record for each radio station, represented as row 401. Each radio station record 401 includes fields for station name 402, station frequency 404, station city 406, station state 408, station region 410, city code 412, zip code 414, station format 416, coordinate location 418, broadcast range 420, and optionally, program schedule 422.

Program source database 400 can be searched in several ways, once the location for receiver 12 has been determined. As an example, if a GPS coordinate is obtained, this GPS coordinate is compared against coordinate location 418 in each record 401 in program source database 400 to determine which stations are in currently in geographical proximity to the current location of receiver 12.

Although geographical coordinates can be represented in a number of different formats and remain within the scope of the present invention, one of the most popular formats generated by GPS units is degree decimal minutes format. In contrast to the traditional degrees/minutes/seconds format, degree decimal minutes format omits the "seconds" portion of the coordinate, and instead represents the seconds as a decimal fraction of the minutes. Examples of degree decimal format include: N61° 11.0924' and W130° 30.1660'.

There are several available methods for calculating the distance between two points in degree decimal format. One popular approach is the Haversine Formula (from R. W. Sinnott, "Virtues of the Haversine", Sky and Telescope, vol. 68, no. 2, 1984, p. 159):

$\to dlon = lon2 - lon1$  Equation 1A $\to dlat = lat2 - lat1$  Equation 1B $\to a = (\sin(dlat/2))^2 + \cos(lat1) * \cos(lat2) * (\sin(dlon/2))^2$  Equation 1C $\to c = 2 * \arcsin(\min(1, sqrt(a)))$  Equation 1D $\to d = R * c$  Equation 1E Where, lat1,lon1 and lat2,lon2 are in spherical coordinates, c is the great circle distance in radians, and and the great circle distance d will be in the same units as R.

To convert decimal degrees to radians, multiply the number of degrees by pi/180=0.017453293 radians/degree.

To express c in decimal degrees, multiply the number of radians by 180/pi=57.295780 degrees/radian.

Once the distance between receiver 12 and station is known, this computed distance can then be compared to the broadcast range 420 of each station to determine if the receiver is in broadcast proximity to the station. In this way, a list/data structure of currently receivable stations can be constructed. Once the list/data structure of currently receivable stations is known, these stations can then be assigned to predefined program format selection buttons 138 and/or user defined selection buttons 160 within receiver 12.

If location information is entered in the form of a city code, database 400 can be simply searched for records which contain a matching city code in field 412. Similarly, if location information is entered in the form of a city name, database 400 can be searched for records which contain a matching city name in field 406.

If location information is entered in the form of a zip code, database 400 can be searched for records where the numeric value of the entered zip code is within a predefined numeric range of the station zip code contained in field 414. Since there is a relatively close correlation between a city's zip code and its geographical location, this relationship can be used to determine geographical proximity. If a rough approximation is all that is needed, an example search might build a list of candidate stations if the absolute difference in relative zip codes between the entered zip code value and the station zip code is less than, for example, 1000. If a more accurate determination is required, a product entitled ZIPFIND® from Bridger Systems Inc. will find the distance between any two zip codes.

As described previously, program source database 400 includes an optional field for program schedule. In a preferred embodiment, this field contains a pointer to a new data structure, illustrated in FIG. 4B, that contains programming information for a given broadcast station.

Figure 4B:
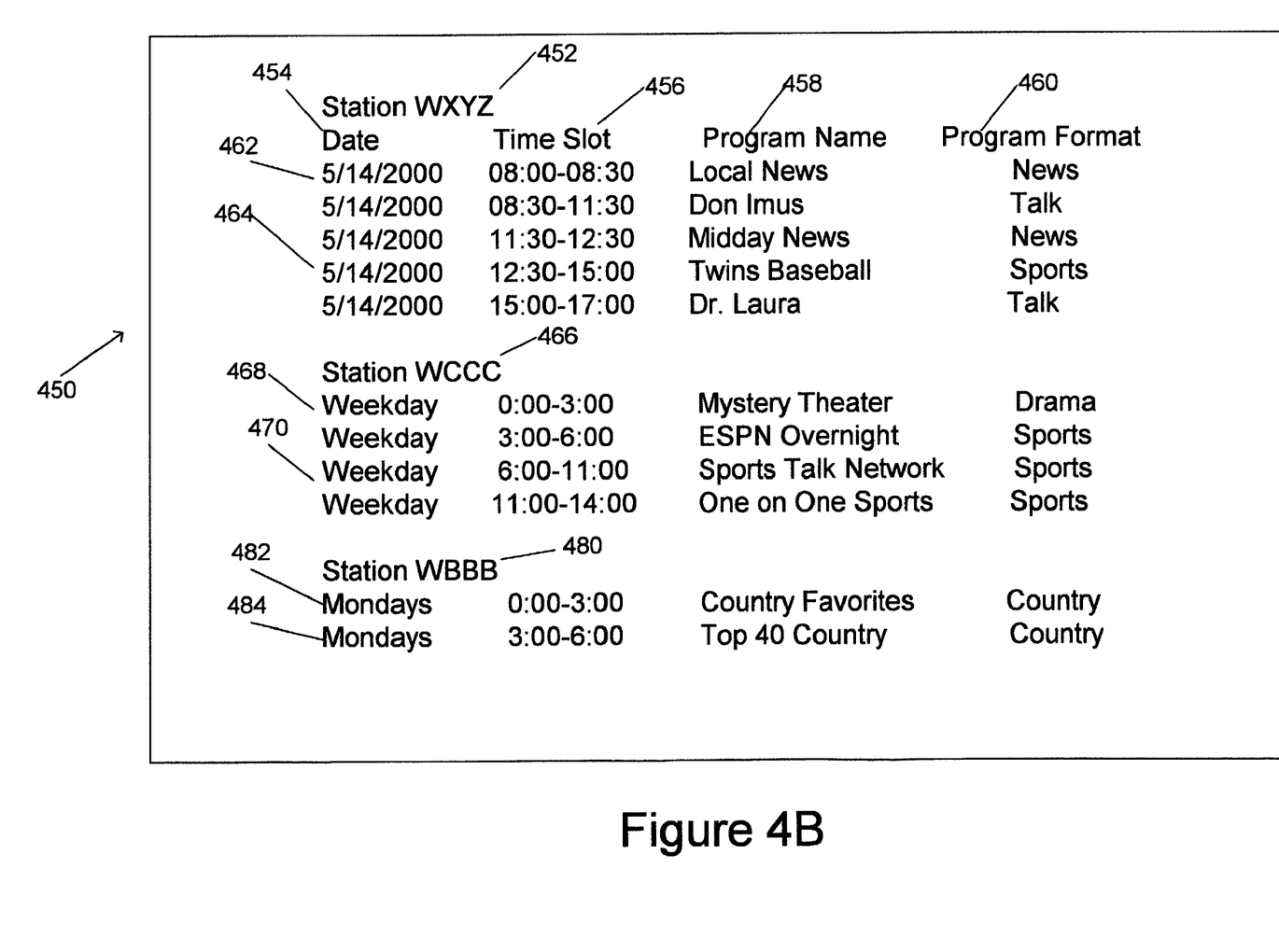
FIG. 4B is a representation of an example database/data structure of program formats utilized by the automatic broadcast channel tuning apparatus of the present invention.

Referring now to FIG. 4B, a representation of an example database/data structure of program formats is illustrated generally at 450. A data structure containing the programming schedule for broadcast station "WXYZ" is shown at 452. In the illustrated embodiment, the data structure 452 contains a date field 454, a program time slot field 456, a program name field 458, and a program format field 460. An example record is shown at 462 for a particular program. Record 462 indicates that on May 14, 2000, local news will be broadcast from 8:00 am to 8:30 am. Another example record 464 indicates that Twins baseball will be broadcast from 12:30-3:00 p.m. on May 14, 2000. In this manner, database 452 can contain a record for every program during every broadcast day for station WXYZ.

While some broadcast stations might be able to provide the detail of programming information as shown in 452, programming information for other stations might take on a more abbreviated, but still useful, form. A data structure containing program information for broadcast station "WCCC" is shown at 466. In this instance, rather than having to specify every single day of programming information, as shown at 452, a more generalized programming representation is used. For instance, record 468 indicates that on every weekday (e.g., Monday-Friday), station "WCCC" broadcasts "Mystery Theater" from midnight (0:00) to 3 a.m. (3:00). Similarly, record 470 indicates that from 6:00 am to 11:00 am on weekdays, the program "Sports Talk" is broadcast. This abbreviated representation, while perhaps not always completely accurate, greatly simplifies the representation of the programming schedule, and greatly reduces the amount of space necessary to store the program schedule. The abbreviated representation also substantially reduces the maintenance work involved in keeping the information up-to-date.

Yet another data structure containing program information for example broadcast station "WBBB" is shown at 480. This instance is a sort of "middle ground" representation of programming information, having less detail than data structure 452, yet greater detail than data structure 466. For instance, record 482 indicates that on every Monday, station WBBB broadcasts the program "Country Favorites" from midnight to 3:00 am. Similarly, record 484 indicates that on every Monday, station WBBB broadcasts the program, "Top 40 Country" from 3:00 a.m. to 6:00 a.m.

Taken together, database of broadcast sources 400 and program information 450 present a comprehensive source of information on station formats and programming that can easily be searched, based on location information and a set of user preferences.

Figure 5:
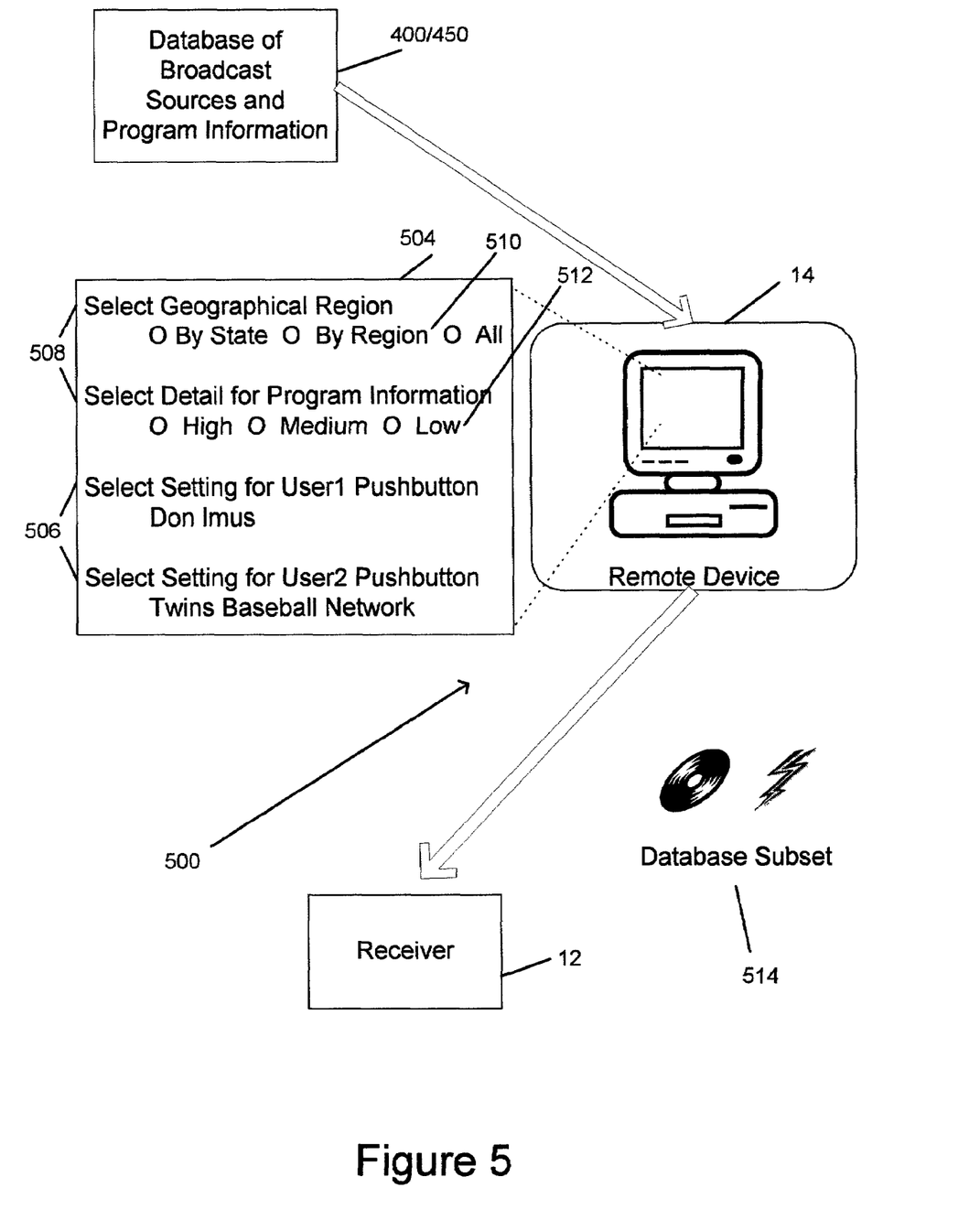
FIG. 5 is a block flow diagram illustrating a process for transferring the database of broadcast sources and program information and user preferences from a remote device to the receiver in accordance with the present invention.

Turning now to FIG. 5, a block flow diagram illustrates at 500 a process for transferring the database of broadcast sources 400 and program information 450 and user preferences from a remote device to receiver 12 in accordance with the present invention. Since the database of broadcast sources 400 and program information 450 previously illustrated in FIG. 4A and FIG. 4B is very dynamic, it is important to provide a convenient mechanism whereby the information can be easily updated within receiver 12 on a periodic basis. The database of broadcast sources 400 and program information 450 can also be quite large. Given that there are over 4600 AM and over 8000 FM stations currently operating in the United States, with each station having a myriad of programming information, it may become necessary to selectively define a subset of database information 514 to transfer to receiver 12. This selective filtering of database information enables a quicker and easier transfer of information from remote device 14 to receiver 12, and greatly reduces the amount of memory 26 that must be present within receiver 12.

In a preferred embodiment, the user can define both custom program choice information and database information filtering though the definition of user preferences. As previously described, the definition of user preferences includes the assignment of custom program choices to user-defined pushbuttons (as shown in FIG. 2, element 160). In one embodiment, the user can select which programming choices to assign to user defined pushbuttons 160 via a user preferences definition program, as shown at block 504. In the illustrated example, the user has chosen to assign "Don Imus" to programmable format selection button "USER 1", and the "Twins Baseball Network" to programmable format selection button "USER 2", as shown generally at 506. User preferences definition program 504 also enables the user to selectively filter the database of broadcast sources and program information to facilitate the transfer and storage of the database at receiver 12, as shown generally at 508. In the illustrated example, if a user is planning to travel only within the state of Minnesota for the foreseeable future, the user indicates that they only wish broadcast source information for a single state, as shown at 510. On a subsequent screen (not shown), the user will then be queried for the name of the state. The program 504 will filter the database to include only station entries where state field 408 contains "Minnesota" or the abbreviation "MN". In this manner, the size of the database of broadcast sources can be reduced by approximately 98%.

If the user is planning to confine their travel to a particular region of the country (e.g., the upper Midwest), the user may select a geographic region filter, as shown at 510. If this option is selected, the user is next presented with a choice of regions to select on a subsequent screen (not shown). If the user selects the upper Midwest region (i.e., where region field 410 contains the value "MW"), only the station entries for the states of: Minnesota, Iowa, Wisconsin, North Dakota, and South Dakota are included in the resulting database. In this manner, the size of the database of broadcast sources can be reduced by approximately 90%.

In a potential embodiment of user preferences definition program 504, the user can select a point on a graphical map representation, and limit the database to stations within a specified radius of the selection point. This reduces problems for users who live at or near the border of a state or region.

Another option to control the size of the database of broadcast sources and program information is shown generally at 512. At 512, the user is asked to select the level of detail of program information desired, and is presented with the options of "High", "Medium" and "Low". As previously shown in FIG. 4B, there are several levels of detail that can be shown for programming information. For instance, there may be program information described for each day (e.g., May 12, 2000, May 13, 2000, etc.). In this case, the user could also indicate that only a few days of future program information is needed, and download again when the end of the current period is reached.

The amount of program information may also be reduced by describing programming only by the day of the week (e.g., Mondays, Tuesdays, Wednesdays, etc.). Finally, describing programming only by a generalized weekday, weekend format, may further reduce the amount of program information. It is possible that a single station may describe their program broadcast schedule in several levels of detail. Thus, by selecting a level of detail at 512, a user can control the size of the database transferred to receiver 12. Only two methods of controlling the size of the database have been illustrated here, however many additional means and methods for controlling the size of the database of broadcast information and broadcast sources are conceivable within the scope of the present invention.

Additional modifications may be made to the illustrated embodiments without departing from the spirit or scope of the invention. Therefore, the invention lies in the claims hereinafter appended.

I claim:

1. An apparatus for selecting broadcast signals, the apparatus comprising:
   a tuner for receiving a plurality of live AM/FM broadcast signals from a plurality of AM/FM broadcast sources:
   a memory, the memory including:
      a current location of the receiver and current time of day;
      a local, dynamically undatable database of AM/FM broadcast sources for a plurality of AM/FM broadcast locations, the local, dynamically updatable database including program information associated with each of the plurality of AM/FM broadcast locations for a given time of day;
      a set of listener preferences including pro szram choices; and
   a processor coupled to the tuner and the memory for selecting a group of live AM/FM broadcast signals from the plurality of live AM/FM broadcast signals based on a predetermined selection criteria and the local, dynamically updatable database of AM/FM broadcast sources for a plurality of AM/FM broadcast locations,
   wherein the predetermined selection criteria includes the plurality of receivable AM/FM broadcast signals, the current location of the receiver and current time of day, and the set of listener preferences including program choices.

2. The apparatus of claim 1, wherein the current location of the receiver is entered by the listener.

3. The apparatus of claim 2, wherein the current location entered by the listener is a zip code.

4. The apparatus of claim 2, wherein the current location entered by the listener is a city code.

5. The apparatus of claim 2, wherein the current location entered by the listener is a city name.

6. The apparatus of claim 2, wherein the current location entered by the listener is entered via a keypad integral to the apparatus.

7. The apparatus of claim 2, wherein the current location entered by the listener is entered via voice input.

8. The apparatus of claim 1, wherein the current location of the receiver is provided by a global positioning system (GPS) receiver integral to the apparatus.

9. The apparatus of claim 1, wherein the current location of the receiver is provided by a global positioning system (GPS) receiver external to the apparatus.

10. The apparatus of claim 1, wherein the current location of the receiver is provided by a cellular phone integral to the apparatus.

11. The apparatus of claim 1, wherein the current location of the receiver is provided by a cellular phone external to the apparatus.

12. The apparatus of claim 1, wherein the local, dynamically updatable database of AM/FM broadcast sources is provided to the receiver by a CD-ROM disc.

13. The apparatus of claim 1, wherein the local, dynamically undatable database of AM/FM broadcast sources is provided to the receiver by a CD-RW disc.

14. The apparatus of claim 1, wherein the local, dynamically updatable database of AM/FM broadcast sources is provided to the receiver by a writable DVD.

15. The apparatus of claim 1, wherein the apparatus flirther includes an 1/0 port for transferring information from an external device to the apparatus.

16. The apparatus of claim 15, wherein the external device is coupled to the I/O port via a wired connection.

17. The apparatus of claim 15, wherein the external device is coupled to the I/O port via a wireless connection.

18. The apparatus of claim 17, wherein the wireless connection is an RE connection.

19. The apparatus of claim 17, wherein the wireless connection is an JR connection.

20. The apparatus of claim 17, wherein the external device is a personal digital assistant (PDA).

21. The apparatus of claim 17, wherein the external device is a personal computer (PC).

22. The apparatus of claim 17, wherein the external device is a wireless phone.

23. The apparatus of claim 17, wherein the transferred information includes the current location of the receiver.

24. The apparatus of claim 17, wherein the transferred information is passed between two or more external devices prior to being passed to the I/O port of the apparatus.

25. The apparatus of claim 17, wherein the transferred information includes the database of broadcast sources and program information.

26. The apparatus of claim 17, wherein the transferred information includes the set of user preferences.

27. The apparatus of claim 26, wherein the set of user preferences includes specific program choices.

28. The apparatus of claim 1, wherein the local database of AM/FM broadcast sources comprises a plurality of broadcast source entries, each of the plurality of broadcast source entries comprising: a station identifier, a station format, a time slot, and a program name.

29. The apparatus of claim 1, wherein the receiver is mounted within a mobile vehicle.

30. The apparatus of claim 1, wherein the receiver is a hand-held device.

31. A method for selecting broadcast signals on a receiver, the method comprising:
    creating a set of listener preferences including pro gram choices;
    loading the set of listener preferences and a database of AM/FM broadcast sources into a local, dynamically undatable database on the receiver, the local, dynamically undatable database including program information associated with each of the plurality of AM/FM broadcast sources for a given time of day, and a location associated with each of the broadcast sources;
    determining a location of the receiver and the current time of day;
    receiving a plurality of live AM/FM broadcast channels from a plurality of AM/FM broadcast sources via a tuner;
    searching the local, dynamically undatable database of AM/FM broadcast sources based on the current location of the receiver and the current time of day;
    creating one or more groups of live AM/FM broadcast channels identified by the search based on the set of listener preferences including program choices, wherein each of the one or more groups of live AM/FM broadcast channels correspond to the program choices; and
    presenting the one or more groups of live AM/FM broadcast channels to the listener.

32. The method for selecting broadcast signals of claim 31, wherein the step of determining the location of the receiver further includes:
    receiving a global positioning service (GPS) signal; and
    interpreting the GPS signal.

33. The method for selecting broadcast signals of claim 31, wherein the step of determining the location of the receiver further includes:
    receiving a location signal via a cellular phone; and
    interpreting the location signal.

34. The method for selecting broadcast signals of claim 31, wherein the step of determining the location of the receiver further includes:
    receiving a location identifier code entered by a user; and
    interpreting location identifier code.

35. The method for selecting broadcast signals of claim 31, wherein the step of searching the local, dynamically undatable database of AM/FM broadcast sources based on the location of the receiver further includes:
    extracting a station location from each of a plurality of broadcast source entries residing within the local, dynamically undatable database of AM/FM broadcast sources;
    comparing the station location with the location of the receiver to determine if the receiver is within receiving range of the broadcast source; and
    building a list of receivable broadcast source records for all of the broadcast sources that are within receiving range.

36. The method for selecting broadcast signals of claim 31, wherein the step of presenting the one or more groups of live AM/FM broadcast channels to the user further includes the step of:
    assigning the one or more groups of live AM/FM broadcast channels to one or more user selectable controls on the receiver.

* * * * *

UNITED STATES PATENT AND TRADEMARK OFFICE
CERTIFICATE OF CORRECTION

PATENT NO.         : 7,587,185 B2  
APPLICATION NO. : 09/903131  
DATED                 : September 8, 2009  
INVENTOR(S)       : Wright J. Nee It is certified that error appears in the above-identified patent and that said Letters Patent is hereby corrected as shown below:

Claim 1, Column 12, Line 47: "pro szram" should be -- program --.

Signed and Sealed this

Tenth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,587,185 B2 Page 1 of 1
APPLICATION NO. : 09/903131
DATED : September 8, 2009
INVENTOR(S) : Wright J. Nee It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1570 days.

Signed and Sealed this

Twenty-first Day of September, 2010

David J. Kappos
*Director of the United States Patent and Trademark Office*